United States Patent [19]

Nobori et al.

[11] Patent Number: 5,257,230
[45] Date of Patent: Oct. 26, 1993

[54] MEMORY DEVICE INCLUDING REDUNDANCY CELLS WITH PROGRAMMABLE FUEL ELEMENTS AND PROCESS OF MANUFACTURING THE SAME

[75] Inventors: Kazuhiko Nobori; Taira Iwase, both of Kawasaki; Masamichi Asano, Tokyo; Makoto Takizawa, Kawasaki; Shigefumi Ishiguro, Chigasaki; Kazuo Yonehara; Satoshi Nikawa, both of Yokohama; Koji Saito, Kawasaki, all of Japan

[73] Assignee: Kabushiki Kaisha Toshiba, Kawasaki, Japan

[21] Appl. No.: 565,820

[22] Filed: Aug. 13, 1990

[30] Foreign Application Priority Data

Aug. 11, 1989 [JP] Japan .................. 1-209169
Apr. 5, 1990 [JP] Japan .................... 1-91104

[51] Int. Cl.$^5$ .............................................. G11C 17/16
[52] U.S. Cl. ...................................... 365/200; 365/96; 365/104; 365/178; 365/225.7
[58] Field of Search .............. 365/96, 104, 178, 200, 365/225.7, 184, 206

[56] References Cited

U.S. PATENT DOCUMENTS

| | | | |
|---|---|---|---|
| 4,230,504 | 10/1980 | Kuo | 148/1.5 |
| 4,333,164 | 6/1982 | Orikabe et al. | 365/178 |
| 4,541,074 | 9/1985 | Nultano | 365/178 |
| 4,970,686 | 11/1990 | Naruke et al. | 365/96 |
| 4,985,866 | 1/1991 | Nakaizumi | 365/96 |

FOREIGN PATENT DOCUMENTS 0159928 10/1985 European Pat. Off. .
0183323 6/1986 European Pat. Off. .

OTHER PUBLICATIONS

Naruke et al., A 16Mb Mask ROM with Programmable Redundancy, IEEE Int'l. Solid State Circuits Conf., Feb. 16, 1989, pp. 128-129.

*Primary Examiner*—Joseph L. Dixon
*Assistant Examiner*—Jack A. Lane
*Attorney, Agent, or Firm*—Foley & Lardner

[57] ABSTRACT

There is disclosed an improved semiconductor memory device having a regular memory cell array and a spare memory cell array. Each spare memory cell constituting the spare memory cell array includes a first transistor selected by a read word line, whose drain is connected to a spare bit line and source is connected via a fuse to a power supply, and a second transistor connected between the interconnection between the first transistor and fuse and a ground. The fuse is selectively blown by flowing a blowing current through the fuse by selecting the second transistor through a write line to thereby disconnect a discharge current path of the spare bit line. The threshold voltage of the second transistor of the spare memory cell which is made conductive upon selection by the write line when the blowing current flows through the fuse is higher than a potential difference between a potential generated at the write line connected with another spare memory cell and a ground potential. Such a high threshold voltage is obtained by including in manufacture of the memory cell the steps of implanting impurity ions of a first conductivity type to the channel area of a region on the surface of a semiconductor substrate where transistors including the second transistor of a second conductivity type different from the first conductivity type are formed; and implanting impurity ions of the one conductivity type to the channel area of the second transistor and to the channel area of transistors of a conductivity type different from the second transistor; whereby the impurity ions are implanted twice to the channel area of the second transistor.

3 Claims, 4 Drawing Sheets

FIG. 1A  WRITE WORD LINE L1
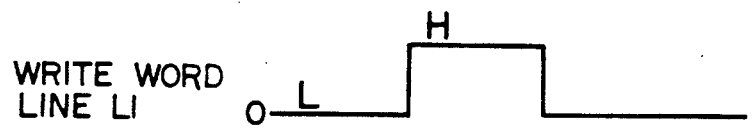
FIG. 1B  FUSE F1
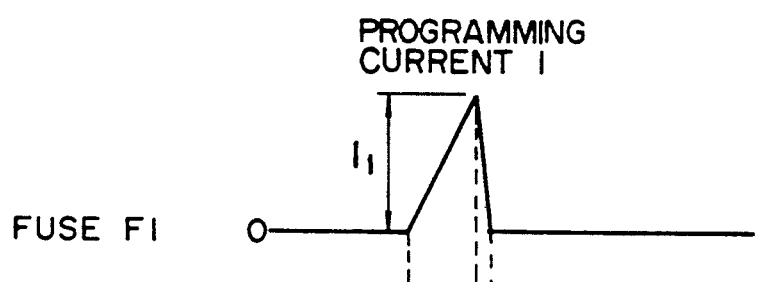
FIG. 1C  WRITE WORD LINE L2
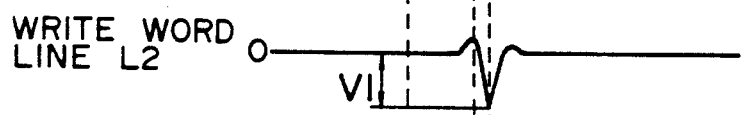
FIG. 1D  GROUND LINE G1
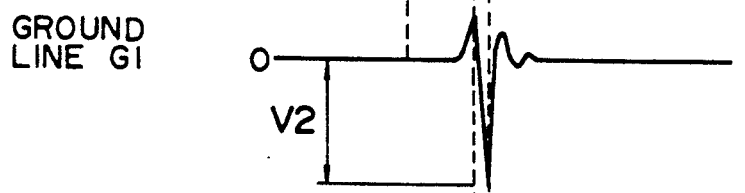
FIG. 1E  POTENTIAL DIFFERENCE $V_{GS}$ BETWEEN L2 & G1
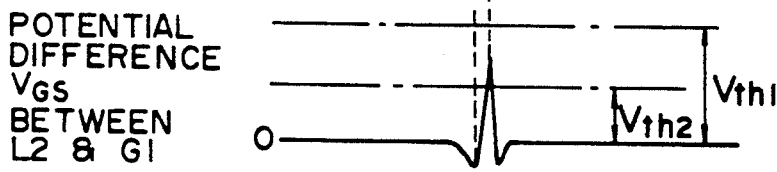

MEMORY DEVICE INCLUDING REDUNDANCY CELLS WITH PROGRAMMABLE FUEL ELEMENTS AND PROCESS OF MANUFACTURING THE SAME

BACKGROUND OF THE INVENTION

The present invention relates to a semiconductor memory device and a process of manufacturing the same. More particularly, the invention relates to a semiconductor memory device having a redundancy circuit for replacing a defective regular memory cell with a spare memory cell, and a process of manufacturing such a memory device replacement.

With the recent developments in semiconductor process technology, semiconductor memory devices have high integration and many functions. At the same time, the yield becomes lower due to fine processing of semiconductor memory devices. To improve the yield and remedy defective memory cells, there are provided spare memory cells on the same semiconductor substrate where regular memory cells are formed, whereby a defected regular memory cell is replaced with a spare memory cell.

Data writing process in mask ROMs is performed at the manufacturing stage so that it is to impossible afterwards to change the data of a memory cell having a defect.

A semiconductor memory device made of mask ROMs having a redundancy circuit for the remedy of a memory cell with a defect by replacing it with a spare one, is proposed in Japanese Patent Application No. 63-204802 (1988) filed by the same assignee of the present invention.

According to this proposal, there is provided a redundancy circuit having spare memory cells capable of remedying a defective memory cell in a mask ROM by writing data even after it has been manufactured, and allowing data storage without the supply of power. As spare memory cells, fuses are used for data writing wherein they are blown or not by a turn-on or turn-off current of a MOS transistor.

This proposal, however, has been found unsatisfactory in that the potential of a write word line fluctuates due to noise from another write word line when a current flows in a transistor connected to the latter line in order to blow a fuse. Accordingly, there arises the problem that a fuse which should not be blown may be blown due to noise upon the blowing of another fuse. The success rate of programming will therefore drop. Such failure occurs within the chip so that it cannot be dealt with externally.

SUMMARY OF THE INVENTION

The present invention has been made in view of the above circumstances, and provides a semiconductor memory device capable of preventing erroneous operation while data is written in a spare memory cell of a redundancy circuit, and a process of manufacturing such a semiconductor memory device.

According to a first aspect of this invention, there is provided a semiconductor memory device having a regular memory cell array and a spare memory cell array, wherein each spare memory cell constituting the spare memory cell array comprises a first transistor selected by a read word line, whose drain is connected to a spare bit line and source is connected via a fuse to a power supply, and a second transistor connected between the interconnection between the first transistor and the fuse and a ground; and the fuse is selectively blown by flowing a blowing current through the fuse by selecting the second transistor through a write line to thereby disconnect a discharge current path of the spare bit line; and wherein when the second transistor of the spare memory cell is made conductive upon selection through the write line and the blowing current flows through the fuse, the second transistor is adapted to have a threshold voltage higher than a potential difference between a potential generated at the write line connected with another spare memory cell and a ground potential.

With such a semiconductor memory device, consider that the fuse of one spare memory cell is blown, and the fuse of another spare memory cell is not blown. In such a case, a predetermined voltage is applied, through the write line connected to the one spare memory cell, to the gate of the fuse blowing control transistor thereof to thereby make the fuse blowing control transistor conductive, whereas the fuse blowing control transistor of the other spare memory cell is maintained non-conductive. When the fuse blowing control transistor of the one spare memory cell is made conductive, blowing current flows from the power supply to the fuse, fuse blowing control transistor and ground, to thereby blow the fuse. Immediately after fuse blowing, the blowing current rapidly reduces so that the potential between the fuse blowing control transistor and the ground changes abruptly, and the potential at the write line connected to the other spare memory cell also changes.

The potential difference of the write line relative to the ground line therefore increases. However, in this case, since the threshold voltage of the fuse blowing control transistor is set to be higher than such a potential difference, the fuse blowing control transistor of the other spare memory cell maintains its non-conductive state. The threshold voltage of fuse blowing control transistors is set such that they will not be made conductive by the influence of the potential change at the time of blowing another fuse. It is accordingly possible to prevent erroneous operation where a fuse which should not be blown is blown.

According to a second aspect of this invention, there is provided a process of manufacturing a semiconductor memory cell having are regular memory cell array and a spare memory cell array, wherein: each spare memory cell constituting the spare memory cell array comprises a first transistor selected by a read word line, whose drain is connected to a spare bit line and whose source is connected via a fuse to a power supply, and a second transistor connected between the interconnection between the first transistor and fuse and a ground; and said fuse is selectively blown by flowing a melting current through the fuse by selecting said second transistor through a write line to thereby disconnect a discharge current path of the spare bit line; comprising the steps of: implanting impurity ions of a first conductivity type to the channel area of a region on the surface of a semiconductor substrate where transistors including the second transistor of a second conductivity type different from the first conductivity type are formed; and implanting impurity ions of the first conductivity type into the channel area of the second transistor and into the channel area of transistors of a conductivity type different from the second transistor; whereby the impurity ions are implanting twice to the channel area of the second transistor.

In a process of manufacturing such a semiconductor memory device, the channel area of a fuse blowing control transistor forming region and the channel area of other transistors of the same conductivity type as that of the fuse blowing control transistor are implanted with impurity ions of the first conductivity type, and the channel area of the fuse blowing control transistor and the channel area of other transistors of the second conductivity type are implanted with impurity ions of the reverse conductivity type. The impurity ions are implanted to the channel area of the fuse blowing control transistor twice so that the impurity concentration becomes higher than that of other transistors of the same conductivity type. The threshold voltage value of the fuse blowing control transistor can therefore be made higher without adding a new process.

BRIEF DESCRIPTION OF THE DRAWINGS

In the accompanying drawings:

FIGS. 1A to 1E show a potential change of a write word line, a change of programming current flowing in a fuse, a potential change of a ground line, respectively of a redundancy circuit of a semiconductor memory device according to an embodiment of this invention;

DESCRIPTION OF THE PREFERRED EMBODIMENT

Figure 2:
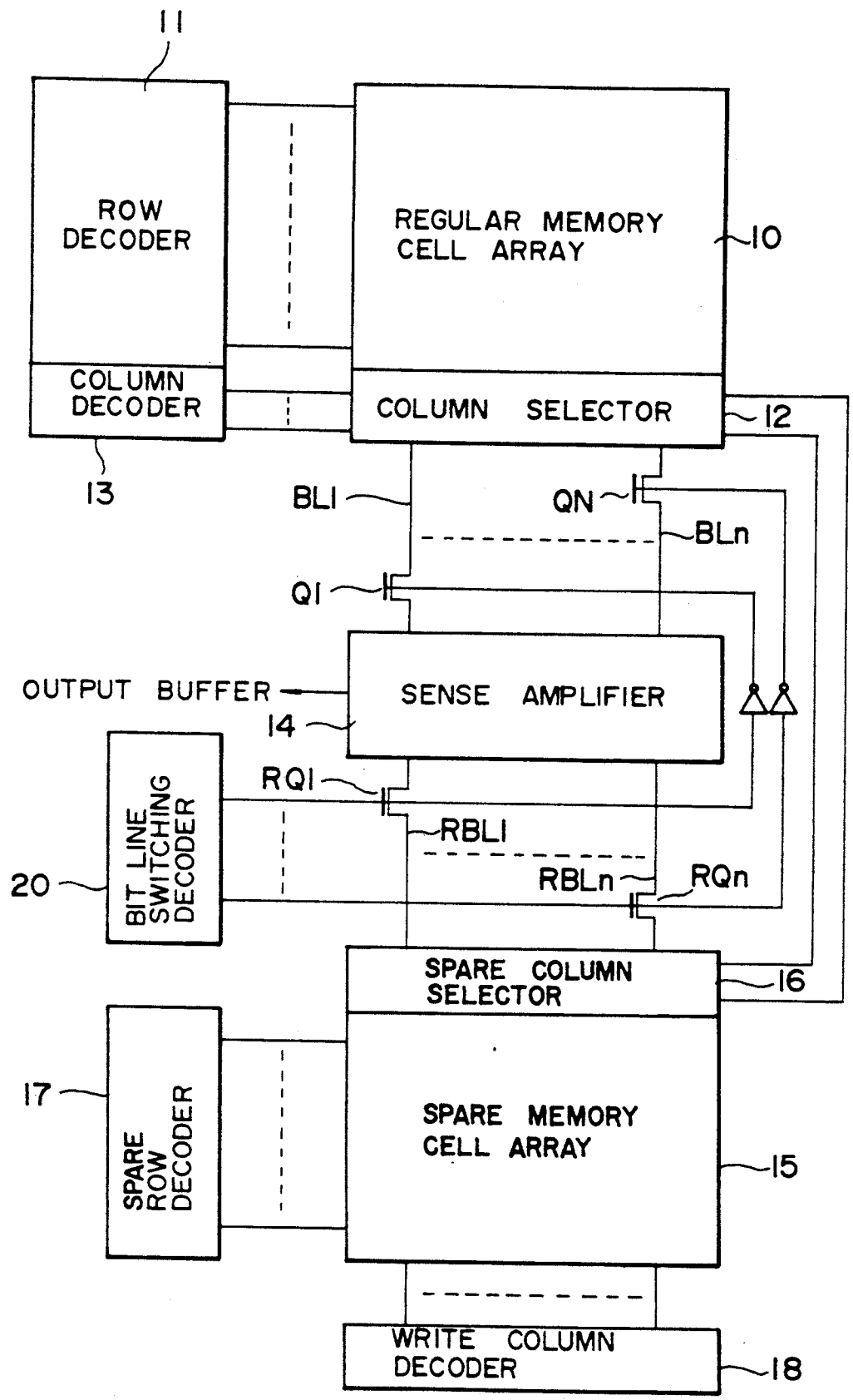
FIG. 2 is a block diagram showing an example of the structure of a mask ROM having a redundacy circuit to which the present invention is applicable.

FIG. 2 is a block diagram showing a structure of a memory device having a redundancy circuit.

A regular memory cell array 10 in which a plurality of memory cells are formed in matrix form is provided. The row address of this regular memory cell array 10 is designated by a row decoder 11 and the column address of the memory cell array 10 is selected by a column selector 12 which is designated by a column decoder 13. The output data of the regular memory cell array is transferred to a sense amplifier via bit lines Bl1-BLn, each having switching element Q1-Qn respectively to output an amplified data to an output buffer.

A spare memory cell array 15 having a spare column selector 16 is also provided. The spare memory cell is designated by a spare row decoder 17 and write column decoder 18. The spare column selector 16 and the sense amplifier 14 is connected redundantly to a plurality of bit lines RBL1-RBLn, each having switching element RQ1-RQn. The switching elements on the corresponding bit line and redundancy bit line are controlled by a bit line switching decoder 20 which enables either of the switching elements Q and RQ.

When a memory cell in the regular memory cell is found to be defective, the corresponding redundancy bit line is enabled by the bit line switching decoder 20 to use the spare memory cell as a normal cell.

Figure 3:
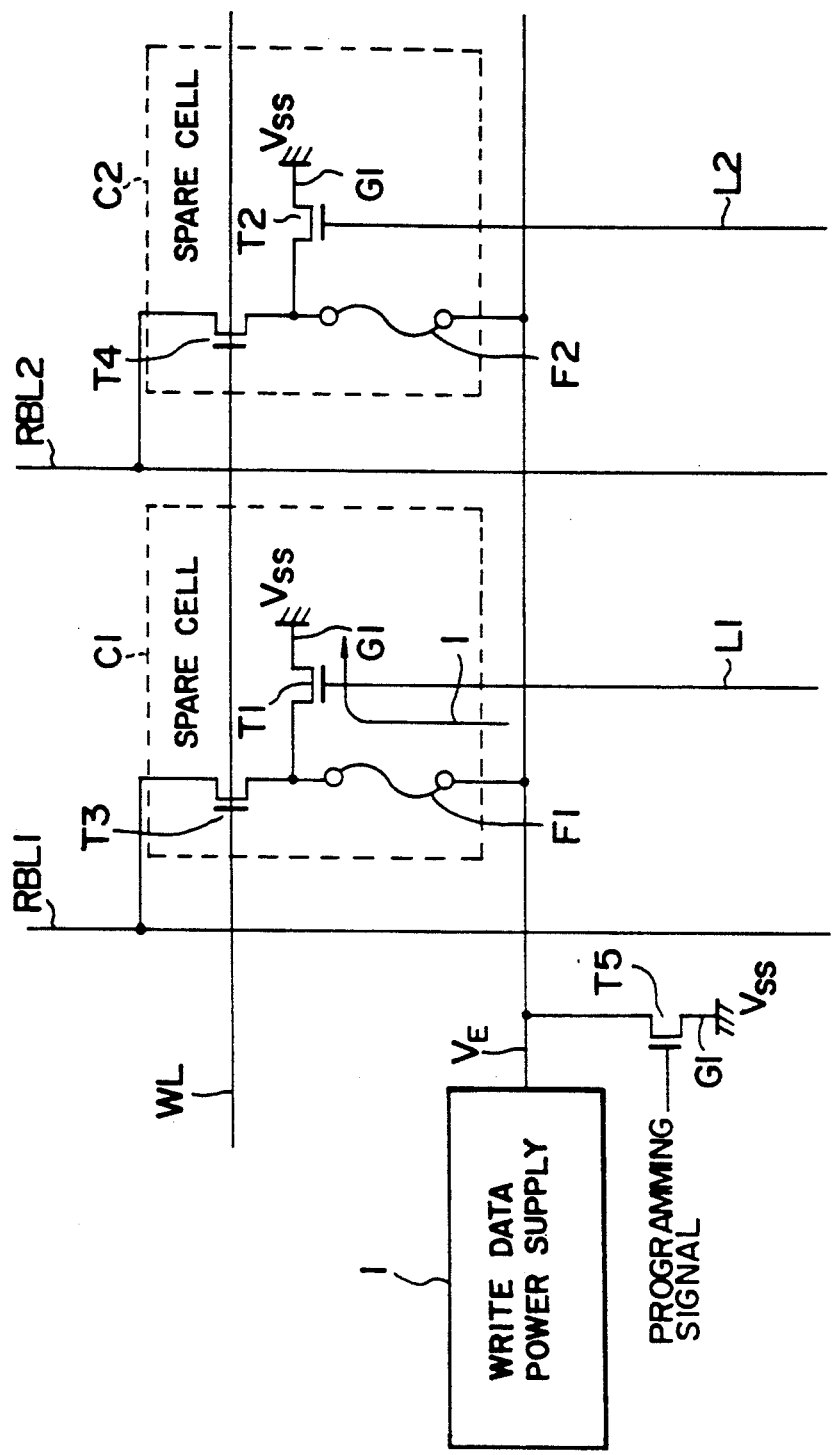
FIG. 3 is a circuit diagram showing an example of the structure of the redundancy circuit.

The fundamental structure of a redundancy circuit embodying the present invention will be described with reference to FIG. 3. There are disposed in matrix form spare memory cells which are used in place of regular memory cells which have any defect. Each memory cell, for example, memory cell C1, is constructed of an N-channel MOS transistor T3 for data reading, N-channel MOS transistor T1 for data writing, and fuse F1.

Transistors T3 and T1 are serially connected between a spare bit line BL1 and ground line G1. One end of fuse F1 is connected to a write data line $V_E$ from which power is supplied, and the other end is connected to an interconnection between transistors T3 and T1.

The gate electrode of transistor T3 is connected to a read word line WL, transistor T3 being made conductive when data is read.

The gate electrode of transistor T1 is connected to a write word line L1. In writing data, transistor T1 is made conductive to blow fuse F1, and made non-conductive not to blow fuse F1.

One end of the write data line $V_E$ with one end of fuse F1 connected thereto, is connected to a write data power supply 1. This power supply 1 supplies power for blowing fuse F1.

Also connected to the write data line $V_E$ is one end of an N-channel MOS transistor T5 whose other end is connected to the common ground line G1. The conduction of transistor T5 is controlled by a programming signal. When writing data, a programming signal of low level is supplied and transistor T5 is made non-conductive. When reading data, a programing signal of high level is supplied and transistor T5 is made conductive and the level of the write data line $V_E$ is lowered to a ground potential $V_{SS}$.

Other memory cells are constructed in the same manner as spare memory cell C1 described above. For example, a spare memory cell C2 connected to the same write data line $V_E$ is constructed of an N-channel MOS transistor T4 for data reading, N-channel MOS transistor T2 for data writing, and fuse F2.

The operation of writing and reading data will be described. For the operation of writing data, it is assumed that fuse F1 of memory cell C1 is blown and that fuse F2 of memory cell C2 is not blown. While setting the programming signal at low level and making transistor T5 non-conductive, a blown fuse voltage is applied to the write data line $V_E$. Thereafter, the write word line L1 is set at high level to make transistor T1 conductive, whereas the write word line L2 is set at the low level to make transistor T2 non-conductive. A programming current as a blowing current thereby flows from the write data line $V_E$ to fuse F1, transistor T1 and ground line G1 so that fuse F1 is blown. Fuse F2 is not blown because transistor T2 is maintained non-conductive. A data writing operation is completed in the above manner.

In a data reading operation, while setting the programming signal at the high level and making transistor T5 conductive, the write data line VE is set at the ground potential $V_{SS}$. Thereafter, the read word line WL is set at high level to make transistors T3 and T4 conductive. Since fuse F1 has been blown, the spare bit line BL1 takes high level. Whereas, since fuse F2 has not been blown, the spare bit line BL2 becomes low level. In the above manner, the level of the spare bit line changes, depending upon whether the fuse has been blown or not so that the data can be read.

In this embodiment, transistors T1 and T2 for data writing have a threshold value Vth1. The data writing operation will be further detailed with reference to FIG. 1A to 1E which show the potential of the write word line L1 at the time of blowing the fuse and the potential V1 of the write word line L2, the programming current I flowing through fuse F1, a change of potential V2 of the ground line G1, and a difference $V_{GS}=(V1-V2)$ between potentials at the write word line L2 and ground line G1.

It is assumed that fuse F1 only is blown and fuse F2 is not blown. Of the write word lines, the word line L1 is set at the high level, as shown in FIG. 1A, and the word line L2 is set at low level. Consequently, transistor T1 becomes conductive and transistor T2 becomes non-conductive, so that the programming current I flows only through fuse F1. The programming current increase as shown in FIG. 1B and when it reaches a current value I1 at which fuse can be blown, fuse F1 is blown so that the programming current I rapidly reduces.

At this time, noise is generated between another write word line L2 and ground line G1 so that the potential V1 of the write word line L2 and the potential V2 of the ground line G1 change as shown in FIGS. 1C and 1D, and the potential difference therebetween increases. According to this invention, the threshold voltage value of transistor T2 is set to larger than the potential difference $V_{GS}$ as shown is FIG. 1E. Therefore, transistor T2 maintains its non-conductive state, so that the program current I will not flow through fuse F2 and it will not be blown.

In the case where fuse F2 of memory cell C2 is blown, and fuse F1 of memory cell C1 is not blown, the above operations for cell C1 side and cell C2 side are reversed. Specifically, the write word line L2 is set at high level and the write word line L1 is set at low level, so that only transistor T2 is made conductive to allow the programming current I to flow through fuse F2 and 1 it is blown. Immediately after blowing, noises are generated between the write word line L1 and ground line G1 and the potential difference $V_{GS}$ therebetween increases. However, also in this case, the threshold voltage value Vth1 is set to larger than the potential difference $V_{GS}$ so that transistor T1 maintains its non-conductive state. Accordingly, the programming current will not flow through fuse F1 and it will not be blown.

In contrast, the threshold voltage value of conventional transistors T1 and T2 have been set at Vth2 as shown in FIG. 1E. The potential difference $V_{GS}$ between the write word line L2 and ground line G1 at the time of fuse blowing becomes in excess of the threshold voltage value Vth2 of transistor T2. Accordingly, there arises a program that although the write word line L2 is set at the low level, transistor T2 becomes conductive to allow flow of the programming current through fuse F2 and to blow it.

According to this embodiment, it is possible to prevent an erroneous operation that a fuse which should not be blown is blown.

Such a semicoductor memory device having a higher threshold voltage value Vth1 of transistors T1 and T2 can be manufactured by the following process. Sectional views of a memory cell at respective manufacturing steps are shown in FIGS. 4A to 4C.

Figure 4A:
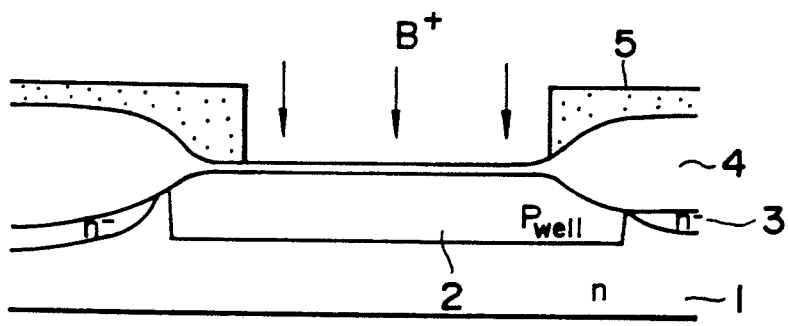
FIGS. 4A to 4C are sectional views of a memory cell illustrating the manufacturing processes of a semiconductor memory device according to an embodiment of this invention.

First, as shown in FIG. 4A, there are formed on the surface of an n-type semiconductor substrate 1, a p-type well 2 in which an element is formed, and a field oxide layer 4 for separating elements. Under the field oxide layer 4, there is formed an n$^-$ type field reversal preventing layer 3. Photo-resist material is coated over the entire surface. Thereafter, removal is performed for the photo-resist film above the region where n-channel transistor elements, including n-channel transistors T1 and T2 with a higher threshold voltage value, are being formed. By using the photo-resist film 5 obtained by such patterning as a mask, boron ions (B+) are implanted as channel ions onto the surface of the element forming region. Thereafter the photo-resist film 5 is removed.

Figure 4B:
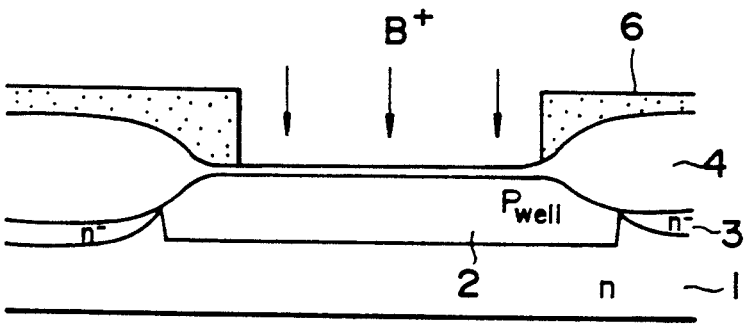
Figure 4C:
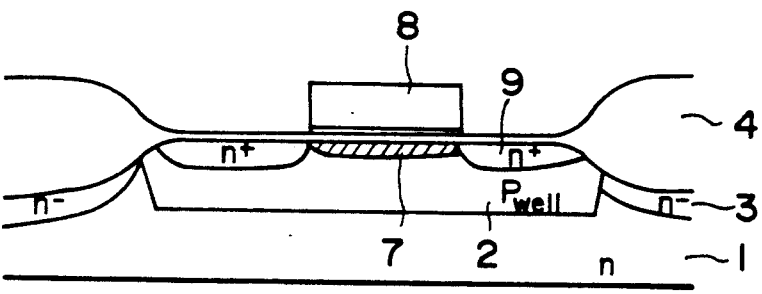

As shown in FIG. 4B, a photo-resist material is coated again over the whole surface. Thereafter removal is performed for the photo-resist film above the p-type transistor element forming region (not shown) and the resist above the region where n-channel transistors T1 and T2 having a higher threshold voltage value are being formed, to thereby obtain a resist 6, thus patterned. By using this resist 6 as a mask, boron ions (B+) are implanted as p-channel ions onto the surface of the element forming regions. Thereafter, the resist 6 is removed. On the surface of the region where transistors T1 and T2 are formed, boron ions (B+) have been implanted twice.

Polycrystalline silicon is patterned on the surface, and phosphorous is doped to the polycrystalline silicon layer to lower the resistivity. After forming a resist (not shown) covering other than the region where a gate electrode is formed, reactive ion etching (RIE) is performed to pattern the polycrystalline silicon layer to thereby obtain a gate electrode 8. Using as a mask this gate electrode 8, arsenic ions (As+) for example are implanted to form an N+ type diffusion layer 9 serving as a draw in or source region (FIG. 4C). The channel region 7 of transistors T1 and T2 has a higher p-type impurity concentration and threshold voltage value Vth1 than other n-channel transistors.

As described above, according to the process of this embodiment, the same type of ions (boron ions) are used for p-type channel ion implantation and for channel ion implantation of n-channel transistors. In implanting ions to the channel region of n-type transistors other than T1 and T2 and p-type transistors, these ions are again implanted to transistors T1 and T2. There is no need for adding a new process for raising the threshold voltage value Vth1 of transistors T1 and T2, thereby reducing the manufacturing time and cost.

The above embodiments are described by way of example only. The present invention is not limited thereto. For instance, although N-channel MOS transistors are used as transistors for data writing in the embodiments, p-channel MOS transistors may also be used. In this case, the threshold voltage value takes a negative value. The same advantageous effects can be obtained by setting the absolute value of the threshold voltage value Vth to larger than the absolute value of the potential difference $V_{GS}$ between the write word line and ground line. The structure of the redundancy circuit may be different from that shown in FIG. 3, provided that the number of spare memory cells is two or more.

As appreciated from the foregoing description of the semiconductor memory device according to this invention, the threshold voltage of fuse blowing control transistors are set such that they are not adversely affect by a potential change at a spare memory cell when another memory cell connected to the same power supply line is blown. Accordingly, it is possible to prevent an erroneous operation that a fuse which should not be blown is blown. Such a semiconductor device having a higher threshold voltage value can be manufactured without adding a new process by implanting ions twice to the channel region of fuse blowing control transistors, namely at the time when ions are implanted to the channel region of transistors having the same conductivity type of the fuse blowing control transistor and at the time when ions are implanted to the channel region of transistors having the opposite conductivity type, while reducing the manufacturing time and cost.

What is claimed is:

1. A semiconductor memory device having a regular memory cell array and a spare memory cell array, wherein:

each spare memory cell constituting said spare memory cell array comprises a first transistor selected by a read word line, whose drain is connected to a spare bit line and whose source is connected via a fuse to a power supply, and a second transistor connected between said source and a ground;

wherein: said fuse is selectively blown out by flowing a blow out current through said second transistor selected by a write line, thereby to disconnect a discharge current path of said spare bit line; and wherein said second transistor has a threshold voltage higher than a potential difference between a potential generated at a write line connected with other spare memory cells and a ground potential when one of said second transistors of said other spare memory cells is selected to be made conductive to flow said blow out current therethrough for blowing out said fuse.

2. A semiconductor memory device according to claim 1, wherein said regular memory cell array is constructed of masked ROMs.

3. A process for manufacturing a semiconductor memory device having a regular memory cell array and a spare memory cell array, wherein;

each spare memory cell constituting said spare memory cell array comprises a first transistor selected by a read word line whose drain is connected to a spare bit line and whose source is connected via a fuse to a power supply, and a second transistor connected between said source and a ground; and a fuse is selectively blown out by flowing a blowout current through said second transistor selected by a write line to thereby disconnect a discharge current path of said spare bit line; comprising the steps of:

implanting impurity ions of a first conductivity type in the channel area of a region on the surface of a semiconductor substrate where transistors including said second transistor of a second conductivity type different from said first conductivity type are formed; and implanting impurity ions of said first conductivity type only in the channel area of said second transistor and in the channel area of transistors of a conductivity type different from said second transistor, to implant said impurity ions twice in the channel area of said second transistor, whereby each of said second transistors of said spare memory cells has a threshold voltage higher than a potential difference between a potential generated at a write line connected with another spare memory cell and a ground potential when said second transistor of said another spare memory cell is selected to be made conductive to flow said blowout current therethrough for blowing out said fuse of said another spare memory cell.

* * * * *